(12) United States Patent
Yan et al.

(10) Patent No.: US 11,411,503 B2
(45) Date of Patent: Aug. 9, 2022

(54) VOLTAGE SENSING OF AN ACTIVE CLAMP SWITCHING POWER CONVERTER CIRCUIT USING AN AUXILIARY WINDING HAVING A SAME POLARITY AS A PRIMARY WINDING

(71) Applicant: Huayuan Semiconductor (Shenzhen) Limited Company, Shenzhen (CN)

(72) Inventors: Liang Yan, Fremont, CA (US); Richard M. Myers, Grass Valley, CA (US); Junjie Zheng, Cupertino, CA (US)

(73) Assignee: Huayuan Semiconductor (Shenzhen) Limited Company, Shenzhen (CN)

( * ) Notice: Subject to any disclaimer, the term of this patent is extended or adjusted under 35 U.S.C. 154(b) by 47 days.

(21) Appl. No.: 17/127,440

(22) Filed: Dec. 18, 2020

(65) Prior Publication Data

US 2021/0211058 A1 Jul. 8, 2021

Related U.S. Application Data

(63) Continuation of application No. 16/734,160, filed on Jan. 3, 2020, now Pat. No. 10,985,665.

(51) Int. Cl.
*H02M 3/335* (2006.01)
*H02M 3/158* (2006.01)
*H03K 17/0814* (2006.01)
*H02M 1/00* (2006.01)
*H02M 1/34* (2007.01)

(52) U.S. Cl.
CPC ....... *H02M 3/33569* (2013.01); *H02M 3/158* (2013.01); *H02M 3/33507* (2013.01); *H02M 1/0058* (2021.05); *H02M 1/342* (2021.05); *H03K 17/08142* (2013.01)

(58) Field of Classification Search
CPC ............. H02M 3/33569; H02M 3/158; H02M 3/33507; H02M 1/058; H02M 1/342
See application file for complete search history.

(56) References Cited

U.S. PATENT DOCUMENTS

| | | | |
|---|---|---|---|
| 6,693,812 B1 * | 2/2004 | Li ..................... | H02M 3/33507 363/97 |
| 10,985,665 B1 | 4/2021 | Yan et al. | |

(Continued)

OTHER PUBLICATIONS

United Stated Office Action, U.S. Appl. No. 16/823,289, dated Jun. 15, 2021, 26 pages.

(Continued)

*Primary Examiner* — Rafael O De Leon Domenech
(74) *Attorney, Agent, or Firm* — Fenwick & West LLP

(57) ABSTRACT

An active clamp switching power converter circuit includes a primary-side sensing circuit that generates a sensed voltage based on an auxiliary winding voltage of an auxiliary winding around the core having a same polarity as the primary winding. Based on the sensed voltage, a controller controls switching of a power switch coupled to the primary winding to control current through the primary winding and controls switching of an active clamp switch to control leakage current when the power switch is turned off. The controller regulates timing of the switching to turn on the power switch based on timing of a zero voltage switching condition for power efficient operation.

20 Claims, 3 Drawing Sheets

(56) References Cited

U.S. PATENT DOCUMENTS

| | | |
|---|---|---|
| 2005/0174811 A1 | 8/2005 | Liu et al. |
| 2015/0035508 A1 | 2/2015 | Kim et al. |
| 2016/0359403 A1 | 12/2016 | Werner et al. |
| 2017/0214325 A1 | 7/2017 | Chang et al. |
| 2017/0264206 A1 | 9/2017 | Rana et al. |
| 2018/0069480 A1 | 3/2018 | Koo et al. |
| 2018/0131286 A1* | 5/2018 | Song ................. H02M 3/33538 |
| 2019/0140550 A1 | 5/2019 | Song et al. |
| 2019/0348920 A1 | 11/2019 | Wong et al. |
| 2020/0083811 A1 | 3/2020 | Koo et al. |
| 2020/0091826 A1 | 3/2020 | Yang et al. |
| 2020/0091827 A1 | 3/2020 | Chen et al. |
| 2020/0106368 A1 | 4/2020 | Chen et al. |
| 2020/0212813 A1* | 7/2020 | Chen .................... H02M 1/083 |
| 2020/0220465 A1* | 7/2020 | Koo .................... H02M 3/3353 |
| 2020/0251992 A1* | 8/2020 | Peng .................. H02M 3/3353 |
| 2020/0395863 A1 | 12/2020 | Song et al. |
| 2021/0058002 A1 | 2/2021 | Wong et al. |

OTHER PUBLICATIONS

International Search Report and Written Opinion, Patent Cooperation Treaty Application No. PCT/US2020/062363, dated Feb. 1, 2021, eight pages.

* cited by examiner

VOLTAGE SENSING OF AN ACTIVE CLAMP SWITCHING POWER CONVERTER CIRCUIT USING AN AUXILIARY WINDING HAVING A SAME POLARITY AS A PRIMARY WINDING

CROSS REFERENCE TO RELATED APPLICATIONS

This application is a continuation of co-pending U.S. application Ser. No. 16/734,160, filed Jan. 3, 2020, which is incorporated by reference in its entirety.

BACKGROUND

The present disclosure relates generally to a switching power converter circuit, and more specifically, to an active clamp switching power converter.

An active clamp switching power converter circuit regulates power delivered to a load by controlling switching of a power switch and reduces power loss by controlling switching of an active clamp switch. However, a challenge exists in controlling timing of the switching for power efficient operation in a manner that does not depend on complex external circuits or high voltage components.

SUMMARY

A switching power converter circuit comprises a transformer coupled between an input terminal receiving an input voltage and an output terminal supplying an output voltage. The transformer including a core, a primary winding around the core coupled to the input terminal, and a secondary winding around the core coupled to the output terminal. The switching power converter circuit further comprises a sensing circuit comprising an auxiliary winding around the core of the transformer having a same polarity as the primary winding. The sensing circuit generates a sensed voltage based on an auxiliary winding voltage across the auxiliary winding. The switching power converter circuit also comprises a power switch coupled to the primary winding of the transformer that controls current through the primary winding. The switching power converter circuit further comprises an active clamp switch to control leakage energy of the switching power converter when the power switch is turned off. A controller controls switching of the power switch to regulate the output voltage and controls switching of the active clamp switch to turn on the active clamp switch following the power switch turning off and to turn off the active clamp switch based on detected timing of the sensed voltage satisfying a predefined condition (e.g., a zero voltage switching condition). In an embodiment, the controller determines that the sensed voltage satisfies the predefined condition by detecting that the sensed voltage equals a latched voltage proportional to the input voltage that is sensed when the power switch is turned on and the active clamp switch is turned off.

In another embodiment, a method is provided for controlling a switching power converter. In a first switching cycle, a controller detects and stores a sensed voltage value that is based on an auxiliary winding voltage across an auxiliary winding and is proportional to an input voltage supplied to a primary winding of the transformer. The sensed voltage value is detected when a power switch is turned on and an active clamp switch is turned off. The controller detects when the sensed voltage value satisfies the stored sensed voltage. The controller controls a turn-off time of the active clamp switch in a subsequent switching cycle relative to the turn-on time of the active clamp switch such that the time when the sensed voltage satisfies the stored sensed voltage in the subsequent switching cycle is closer to a target time than in the first switching cycle.

BRIEF DESCRIPTION OF DRAWINGS

The teachings of the embodiments of the present invention can be readily understood by considering the following detailed description in conjunction with the accompanying drawings.

Figure 1:
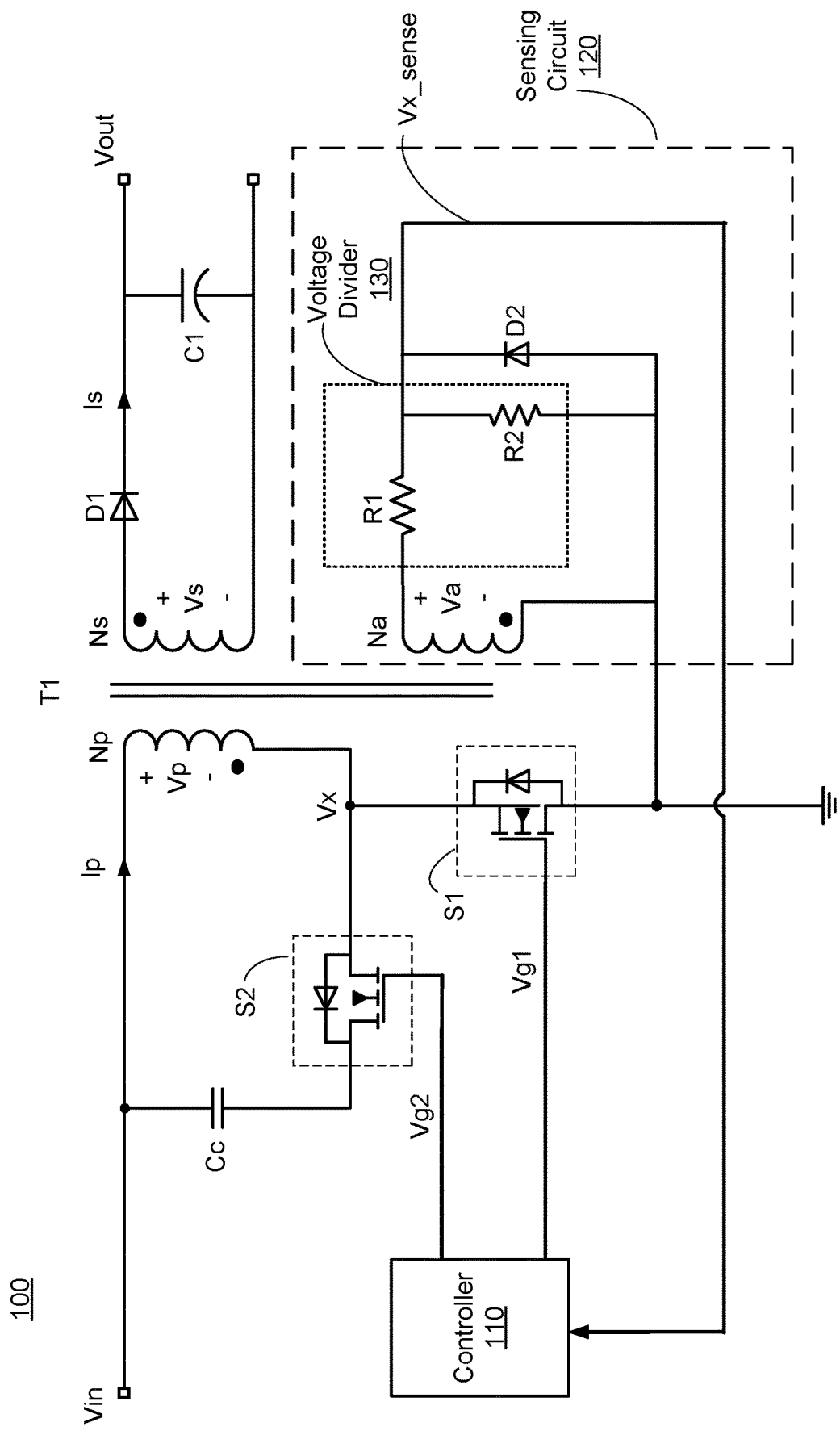
FIG. 1 illustrates a switching power converter circuit, according to one embodiment.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF EMBODIMENTS

The Figures (FIG.) and the following description relate to the preferred embodiments of the present invention by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the disclosure described herein.

Figure (FIG.) 1 illustrates a switching power converter circuit 100 in accordance with one embodiment. The switching power converter circuit 100 generates a regulated output voltage Vout to power a load (e.g., an electronic device (not shown)) based on an input voltage Vin. In an embodiment, the switching power converter circuit 100 includes an active clamp flyback circuit in which leakage energy is recycled to reduce power loss relative to a conventional flyback circuit. The switching power converter circuit 100 may furthermore generate feedback signals for controlling timing of switching for efficient power operation of the switching power converter circuit 100. Particularly, the switching power converter circuit 100 controls a timing of turning off an active clamp switch and turning on a power switch such that the power switch is turned on shortly after a zero voltage switching (ZVS) condition is achieved in which the voltage across the power switch is approximately zero.

In an embodiment, the switching power converter circuit 100 includes a transformer T1, a power switch S1, an active clamp switch S2, an output rectifier diode D1, a clamping capacitor Cc, an output filter capacitor C1, a sensing circuit 120, and a controller 110.

The transformer T1 is coupled between an input terminal receiving an input voltage Vin (e.g., a rectified AC voltage) and an output terminal supplying the output voltage Vout to the load. The transformer T1 includes a magnetic core. A primary winding Np having a first polarity wraps around the core of the transformer T1 in a first direction and is coupled to the input terminal at a first end of the winding Np. A secondary winding Ns having a second polarity (different than the first polarity) wraps around the core of the transformer T1 in a second direction (different than the first direction) and is coupled to the output terminal.

The power switch S1 is coupled to the primary winding Np of the transformer T1 at a second end of the winding Np such that a voltage node Vx is across the power switch S1. The power switch S1 may be a transistor such as a MOSFET, a bipolar junction transistor, or some other type of switch. The power switch S1 is configured to control the primary current Ip through the primary winding Np by enabling the primary current Ip to flow from the input voltage Vin through the primary winding Np to ground when the power switch S1 is on, and preventing the current Ip from flowing to ground when the power switch S1 is off.

When the power switch S1 is off, some leakage energy of the transformer T1 cannot transfer to the load, thereby causing energy loss. The active clamp switch S2 controls the flow of this leakage energy when the power switch S1 is turned off to recycle leakage energy back to the primary winding Np and reduce power loss. The active clamp switch S2 couples between the second end of the primary winding Np (at voltage node Vx) and the input voltage Vin through the clamping capacitor Cc. The active clamp switch S2 may be a transistor such as a MOSFET, a bipolar junction transistor, or some other type of switch.

The sensing circuit 120 includes an auxiliary winding Na that wraps around the core of the transformer T1, a voltage divider 130 (e.g., series resistors R1 and R2), and a clamping diode D2. The auxiliary winding Na is wrapped around the core of the transformer T1 in a same direction and has the same polarity as the primary winding Np. Thus, the voltage Va across the auxiliary winding Na is proportional to the voltage Vp across the primary winding Np in accordance with the turns ratio. The voltage divider 130 divides the auxiliary winding voltage Va to generate a sensed voltage Vx_sense. The clamping diode D2 is coupled between the sensed voltage Vx_sense and ground to clamp the sensed voltage Vx_sense to ground (e.g., zero volts) when the auxiliary winding voltage Va is negative.

The controller 110 controls switching of the power switch S1 and controls switching of the active clamp switch S2. Particularly, the controller 110 controls switching of the power switch S1 so that the power switch S1 has on-times and off-times appropriate to maintain a regulated output voltage Vout. Furthermore, the controller 110 controls switching of the active clamp switch S2 so that it has an on-time during the off-time of the power switch S1 (i.e., so that the on-times of the power switch S1 and the active clamp switch S2 are non-overlapping), to enable recycling of the leakage energy when the power switch S1 is turned off. The controller 110 furthermore controls the relative timings of the on-times and off-times of the active clamp switch S2 and the power switch S1 to enable the power switch S1 to turn on in each switching cycle shortly after a zero voltage switching (ZVS) condition is reached in which the voltage across the power switch S1 is zero or near zero, which enables power efficient switching. The controller 110 achieves these switching conditions based on a sensing technique in which the sensed voltage Vx_sense is sensed to detect the ZVS condition and control switching accordingly. Particularly, the controller 110 detects the ZVS condition by determining when the sensed voltage Vx_sense reaches a predefined voltage representative of (e.g., proportional to) the input voltage Vin, as described in further detail below with reference to FIG. 3.

Figure 2:
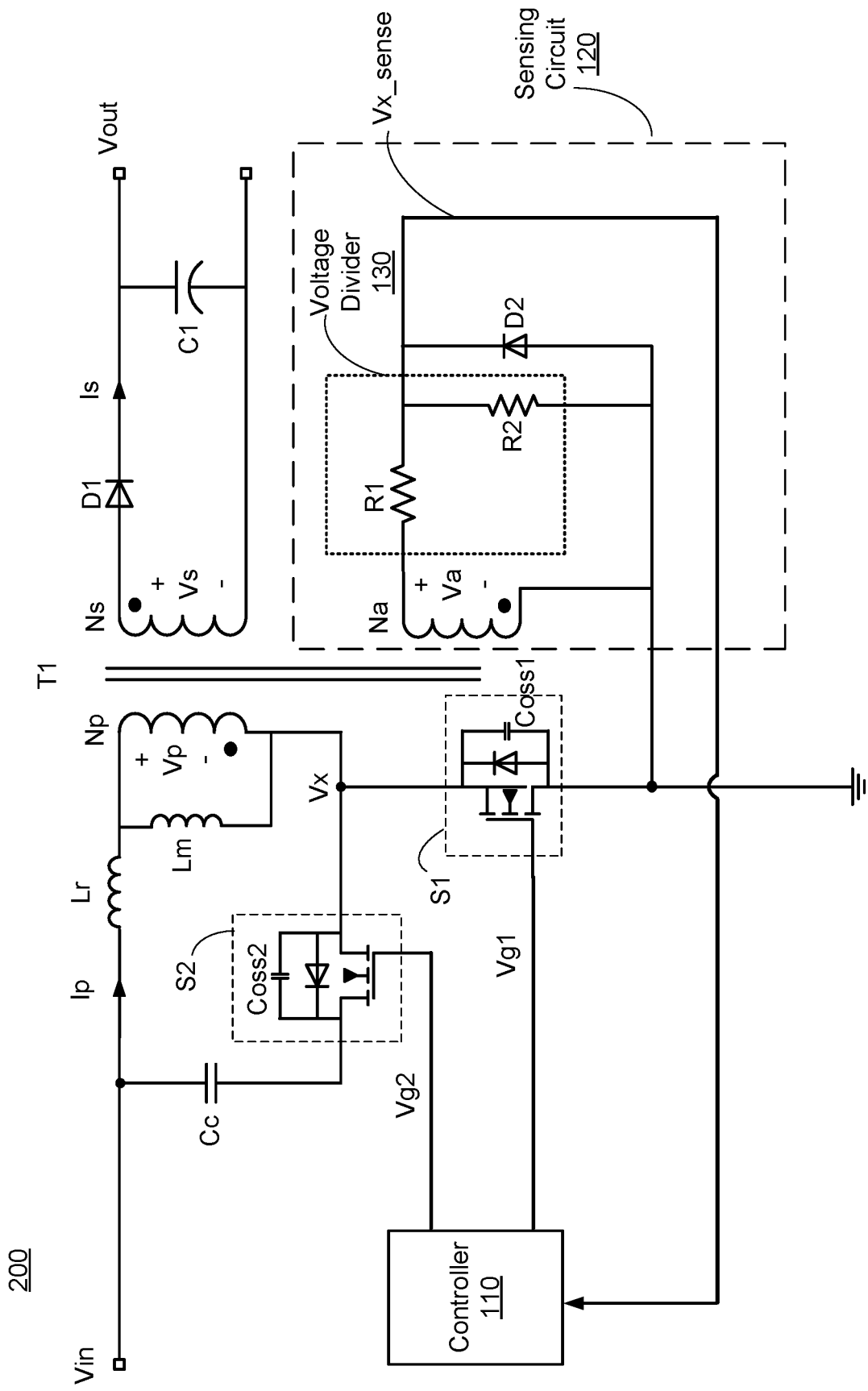
FIG. 2 illustrates the switching power converter circuit with leakage inductance, magnetizing inductance, and parasitic capacitance modeled as circuit elements, according to one embodiment.

FIG. 2 illustrates a model 200 of the switching power converter circuit 100 that models a leakage inductance of the primary winding Np as an inductor Lr, models a magnetizing inductance of the primary winding Np as an inductor Lm, models a drain-source parasitic capacitance of the power switch S1 as a capacitor Coss1, and models a drain-source parasitic capacitance of the active clamp switch S2 as a capacitor Coss2. This model will be referenced in describing the operation of the switching power converter circuit 100 below.

Figure 3:
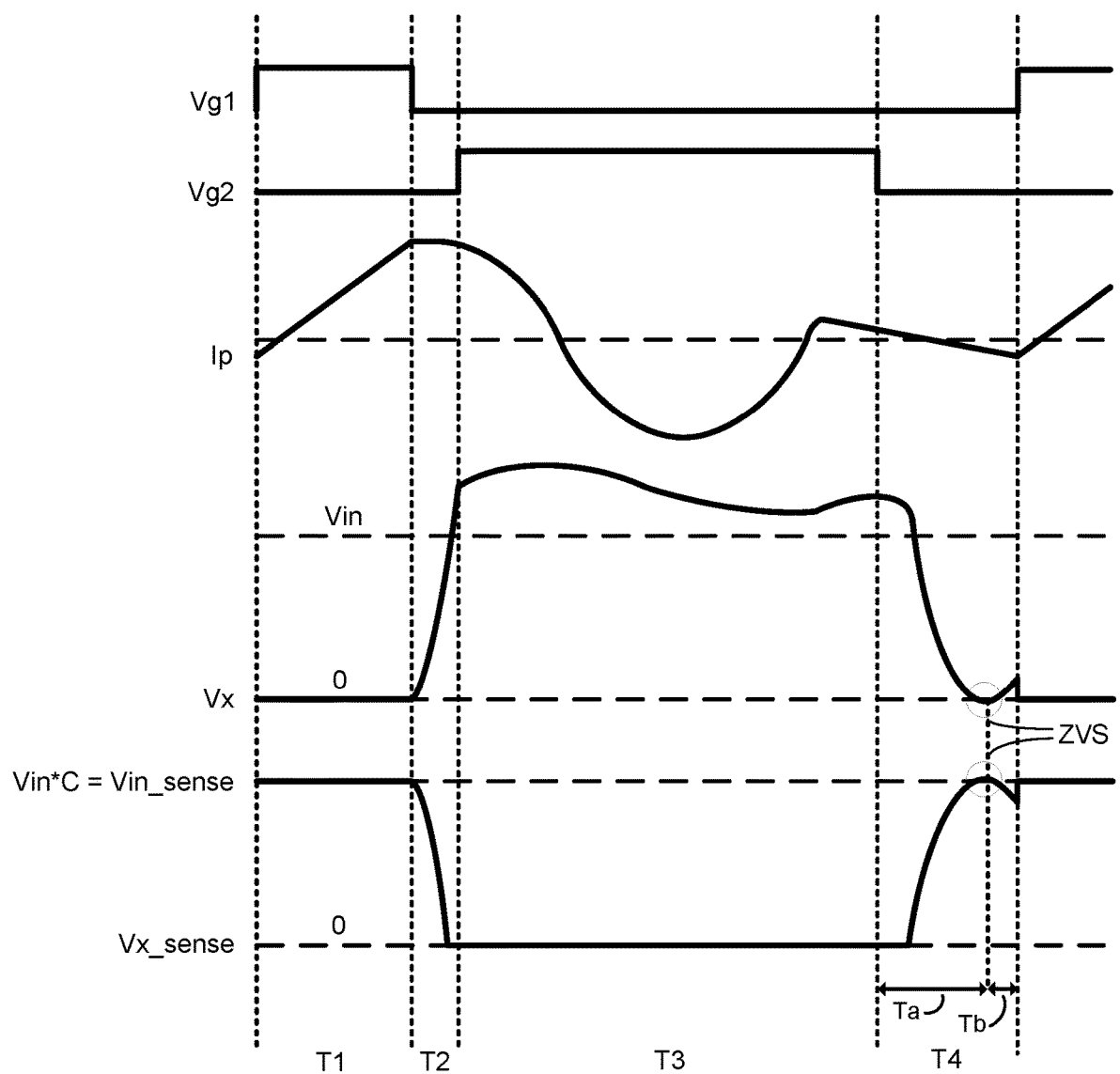
FIG. 3 illustrates waveforms representing operation of a switching power converter circuit, according to one embodiment.

FIG. 3 provides waveforms illustrating the operation of the switching power converter circuit 100 of FIG. 1 in accordance with the model 200 of FIG. 2. Four time frames (T1, T2, T3, and T4) are illustrated that collectively make up one switching cycle. The time frames are not necessarily fixed and some of the time frames may vary between cycles.

During time frame T1, Vg1 has a high value (i.e., the power switch S1 is turned on) and Vg2 has a low value (i.e., the active clamp switch S2 is turned off). The voltage Vx across the power switch S1 is zero (coupled to ground), and the voltage across the primary winding Np (i.e., the voltage Vp) is the input voltage Vin, which causes energy to be stored in the primary winding Np and the primary current Ip to increase. The voltage across the secondary winding Ns (i.e., the voltage Vs) is negative and the output rectifier diode D1 is reverse biased, blocking the transfer of energy to the load. In this state, energy is supplied to the load via the output filter capacitor C1.

The voltage Va across the auxiliary winding Na is proportional to the voltage Vp=Vin across the primary winding Np and is thus given by (Vin/Np)*Na where Np, Na represent the number of turns of the primary and auxiliary windings respectively. The sensed voltage Vx_sense is proportional to the voltage across the auxiliary winding Na (and therefore proportional to Vp=Vin) based on the voltage divider ratio of voltage divider 130.

During time frame T2, Vg1 has a low value (i.e., the power switch S1 is turned off) and Vg2 has a low value (i.e., the active clamp switch S2 is turned off). The primary current Ip from the inductor Lr and the inductor Lm charges up the capacitor Coss1 of the power switch S1 and discharges the capacitor Coss2 of the active clamp switch S2 until the body diode of the active clamp switch S2 starts to conduct. As a result, the voltage Vx across the power switch S1 increases to a level exceeding the input voltage Vin, thereby reverse biasing the primary winding Np and the sensed voltage Vx_sense decreases to zero. Close to the end of time frame T2, the output rectifier diode D1 becomes forward biased enabling the transfer of energy stored in transformer T1 to the load and re-charging of the output filter capacitor C1.

During time frame T3, Vg1 has a low value (i.e., the power switch S1 is turned off) and Vg2 has a high value (i.e., the active clamp switch S2 is turned on). The inductor Lr and the clamping capacitor Cc start to resonant during the transformer T1 reset, as seen by the waveform for the primary current Ip. The leakage current from the primary winding Np charges the clamping capacitor Cc coupled between the active clamp switch S2 and the primary winding Np. The auxiliary winding voltage Va is proportional to the primary winding voltage Vp, and is therefore negative, which causes the clamping diode D2 to conduct and clamp the sensed voltage Vx_sense close to zero.

During time frame T4, Vg1 has a low value (i.e., the power switch S1 is turned off) and Vg2 has a low value (i.e., the active clamp switch S2 is turned off). The primary current Ip drops and the voltage Vx across the power switch S1 decreases to zero and then begins to increase. The voltage across the primary winding Np increases as the voltage Vx across the power switch S1 decreases, and Vp=Vin when Vx=0. The sensed voltage Vx_sense increases proportionally to the voltage Vp across the primary winding, and thus the time when Vx=0 can be detected when Vx_sense= C*Vin, where C is a proportionality constant based on the turns ratio and the voltage divider ratio, i.e., C=(Na/Np) *R2/(R1+R2). This time point when Vx_sense=C*Vin corresponds to the ZVS condition. Once the ZVS condition is achieved, the controller 110 sets Vg1 high to turn the power switch S1 back on and start the next switching cycle.

The controller 110 controls timing of the switching based on the sensed voltage Vx_sense. Particularly, the controller 110 senses the sensed voltage Vx_sense in period T1 during an on-time of the power switch S1 (when the active clamp switch S2 is off) and latches the signal as Vin_sense, which is proportional to the input voltage Vin (e.g., Vin_sense= C*Vin, where C is the proportionality constant based on the turns ratio and voltage divider ratio). In an embodiment, the controller 110 determines to turn off the power switch S1 based on detecting when the primary current reaches a threshold level. For example, the threshold level may be detected by measuring the voltage across a resistor (not shown) placed in between the source connection of the power switch S1 and ground. When the voltage across this resistor equals a threshold level, the power switch S1 is turned off. In another embodiment, the controller 110 turns off the power switch S1 after a predetermined amount of time, which may be estimated to correspond to the amount of time for the primary current Ip to reach the threshold level. The controller 110 controls the active clamp switch S2 to turn on a short time after the power switch S1 turns off in each switching cycle. For example, the controller 110 may turn the active clamp switch S2 on after the voltage Vx across the power switch S1 ramps up to a level above the input voltage Vin, which may be detected by the sensed voltage Vx_sense dropping to zero. The controller 110 adjusts the on-time of the active clamp switch S2 in each switching cycle to turn off the active clamp switch S2 based on timing of the ZVS condition in a previous switching cycle, as described below. The controller 110 then controls the power switch S1 to turn back on a fixed time period Ta+Tb after the active clamp switch S2 turns off, where Ta represents a time between the active clamp switch S2 turning off and the ZVS condition occurring, and where Tb represents a time between the ZVS condition and the power switch S1 being turned on. The fixed time period Ta+Tb may be a predefined time period based on circuit characteristics of the switching power converter circuit 100.

To detect the ZVS condition, the controller 110 senses the sensed voltage Vx_sense after the active clamp switch S2 turns off (and before the power switch S1 turns back on) and determines when the sensed voltage Vx_sense reaches the latched voltage Vin_sense. The controller 110 may then compare the timing of the detected ZVS condition to the actual timing of when the power switch S1 is turned on and/or the active clamp switch S2 is turned off (e.g., detecting the timed Ta, Tb, or both), and adjust the timing of turning off the active clamp switch S2 in subsequent switching cycles so that the times Ta, Tb are closer to respective target times. In other words, given a fixed time period Ta+Tb between when the active clamp switch S2 turns off and the power switch S1 turns on, the controller 110 adjusts when the active clamp switch S2 turns off in a manner that maintains the approximately fixed time period Ta between the off-time of the active clamp switch S2 and the ZVS condition, and maintains the approximately fixed time period Tb between the ZVS condition and when the power switch S1 turns back on.

The controller 110 may control switching of the active clamp switch S2 based on either Ta, Tb, or both. For example, in one control scheme, if the time Tb between the sensed ZVS condition and the power switch S1 turning on is above a target time period in a current switching cycle, then the turn-off time of the active clamp switch S2 is adjusted to turn off the active clamp switch S2 earlier in the next switching cycle (thus decreasing the on-time of the active clamp switch S2). If the time Tb between the sensed ZVS condition and the power switch S1 turning on is below the target time period in the current switching cycle, then the turn-off time of the active clamp switch S2 is adjusted to turn off the active clamp switch S2 later in the next switching cycle (thus increasing the on-time of the active clamp switch S2). In an alternative control scheme that operates equivalently given the fixed value of Ta+Tb, the controller 110 may adjust switching based on detecting the time Ta between the off-time of the active clamp switch S2 and the ZVS condition. For example, the controller 110 adjusts the turn-off time of the active clamp switch S2 to occur later in the next switching cycle if the detected time Ta is greater than a target time period, and adjust the turn-off time of the active clamp switch S2 earlier in the next switching cycle if the detected time Ta is less than the target time period.

Upon reading this disclosure, those of skill in the art will appreciate still additional alternative embodiments through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope described herein.

What is claimed is:
1. A switching power converter circuit comprising:
 a transformer coupled between an input terminal receiving an input voltage and an output terminal supplying an output voltage, the transformer including a core, a primary winding around the core coupled to the input terminal, and a secondary winding around the core coupled to the output terminal;
 a sensing circuit comprising an auxiliary winding around the core of the transformer, the sensing circuit to generate a sensed voltage based on an auxiliary winding voltage across the auxiliary winding;
 a power switch coupled to the primary winding of the transformer, the power switch to control current through the primary winding;

an active clamp switch to control leakage energy of the switching power converter when the power switch is turned off; and a controller to store a reference voltage proportional to the input voltage when the power switch is turned on and the active clamp switch is turned off, to control switching of the power switch to regulate the output voltage, and to control switching of the active clamp switch to turn on the active clamp switch following the power switch turning off and to turn off the active clamp switch based on detected timing of the sensed voltage satisfying a predefined condition based on the reference voltage.

2. The switching power converter circuit of claim 1, wherein the sensing circuit further comprises:
a voltage divider to divide the auxiliary winding voltage to generate the sensed voltage; and
a diode to clamp the sensed voltage to a ground voltage when the auxiliary winding voltage is negative.

3. The switching power converter circuit of claim 1, wherein the controller is configured to detect when the sensed voltage is substantially equal to zero after the power switch is turned off and to turn on the active clamp switch in response.

4. The switching power converter circuit of claim 1, wherein the controller is configured to detect when the sensed voltage satisfies the predefined condition in a first switching cycle, and to control, in a subsequent switching cycle, a turn-off time of the active clamp switch relative to its turn-on time such that the sensed voltage satisfies the predefined condition in the subsequent switching cycle closer to a target time before the turn-on time of the power switch than in the first switching cycle.

5. The switching power converter circuit of claim 4, wherein the turn-on time of the power switch is a substantially fixed time period after the turn-off time of the active clamp switch in each of the first and subsequent switching cycles.

6. The switching power converter circuit of claim 1, wherein the timing of the sensed voltage satisfying the predefined condition corresponds to a timing of a zero voltage switching condition of a voltage across the power switch.

7. The switching power converter circuit of claim 1, wherein the sensed voltage is proportional to a voltage across the primary winding when the power switch is turned on.

8. The switching power converter circuit of claim 1, wherein the active clamp switch when turned on is coupled to conduct the current from the primary winding to charge a clamping capacitor coupled between the active clamp switch and the primary winding.

9. A control circuit for a switching power converter, the control circuit comprising:
an auxiliary winding around a core of a transformer, wherein a sensed voltage is based on an auxiliary winding voltage across the auxiliary winding; and
a controller to store a reference voltage proportional to an input voltage when a power switch is turned on and an active clamp switch is turned off, to control switching of the power switch to regulate an output voltage, and to control switching of the active clamp switch to turn on the active clamp switch following the power switch turning off and to turn off the active clamp switch based on detected timing of the sensed voltage satisfying a predefined condition based on the reference voltage,
wherein the power switch is coupled to a primary winding of the transformer and the active clamp switch controls leakage energy through the primary winding when the power switch is turned off.

10. The control circuit of claim 9, further comprising:
a voltage divider to divide the auxiliary winding voltage to generate the sensed voltage; and
a diode to clamp the sensed voltage to a ground voltage when the auxiliary winding voltage is negative.

11. The control circuit of claim 9, wherein the controller is configured to detect when the sensed voltage is substantially equal to zero after the power switch is turned off and to turn on the active clamp switch at this time.

12. The control circuit of claim 9, wherein the controller is configured to detect when the sensed voltage satisfies the predefined condition in a first switching cycle, and to control, in a subsequent switching cycle, a turn-off time of the active clamp switch relative to its turn-on time such that the sensed voltage satisfies the predefined condition in the subsequent switching cycle closer to a target time before the turn-on time of the power switch than in the first switching cycle.

13. The control circuit of claim 12, wherein the turn-on time of the power switch is a substantially fixed time period after the turn-off time of the active clamp switch in each of the first and subsequent switching cycles.

14. The control circuit of claim 9, wherein the timing of the sensed voltage satisfying the predefined condition corresponds to a timing of a zero voltage switching condition of a voltage across the power switch.

15. The control circuit of claim 9, wherein the sensed voltage is proportional to a voltage across the primary winding when the power switch is turned on.

16. The control circuit of claim 9, wherein the active clamp switch when turned on is coupled to conduct a leakage current from the primary winding to charge a clamping capacitor coupled between the active clamp switch and the primary winding.

17. A method for controlling a switching power converter, the switching power converter including a transformer coupled between an input terminal receiving an input voltage and an output terminal supplying an output voltage, the transformer including a core, a primary winding around the core coupled to the input terminal, a secondary winding around the core coupled to the output terminal, and an auxiliary winding around the core, a power switch coupled to control current through the primary winding, an active clamp switch coupled to return leakage energy to the primary winding during an off-time of the power switch, and a controller, the method comprising:
detecting a reference voltage proportional to the input voltage when the power switch is turned on and the active clamp switch is turned off during a first switching cycle;
storing the reference voltage; and
controlling a turn-off time of the active clamp switch in a subsequent switching cycle relative to a turn-on time of the active clamp switch such that a sensed voltage reaches the stored reference voltage in the subsequent switching cycle closer to a target time than in the first switching cycle.

18. The method of claim 17, wherein the turn-on time of the power switch is a substantially fixed time period after the turn-off time of the active clamp switch in each of the first and subsequent switching cycles.

19. The method of claim 17, wherein a timing of the sensed voltage satisfying the stored reference voltage corresponds to a timing of a zero voltage switching condition of a voltage across the power switch.

20. The method of claim 17, wherein the sensed voltage is proportional to a voltage across the primary winding when the power switch is turned on.

\* \* \* \* \*